United States Patent
Su et al.

(10) Patent No.: US 6,363,026 B1
(45) Date of Patent: Mar. 26, 2002

(54) ADDRESS GENERATING DEVICE FOR USE IN MULTI-STAGE CHANNEL INTERLEAVER/DEINTERLEAVER

(75) Inventors: Sung-il Su; Beong-Jo Kim, both of Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/615,415

(22) Filed: Jul. 13, 2000

(30) Foreign Application Priority Data

Jul. 13, 1999 (KR) .............................. 99-29198

(51) Int. Cl.$^7$ .............................................. G11C 13/00
(52) U.S. Cl. ........................ 365/230.01; 365/185.03; 365/231
(58) Field of Search .................. 365/230.01, 230.03, 365/230.06, 231, 185.03

(56) References Cited

U.S. PATENT DOCUMENTS 6,178,114 B1 * 1/2001 Yang ..................... 365/185.03

* cited by examiner

Primary Examiner—Terrell W. Fears
(74) Attorney, Agent, or Firm—Dilworth & Barrese, LLP (57) ABSTRACT

An address generating device for addressing data stored in an interleaver memory in B rows and F columns, where F is not $2^k$ for a positive integer k. A row counter being responsive to B clock pulses, outputs carry signal when the row counter count to B−1, outputs the 0 value when the first row address is outputting, outputs the added value of offset value F and previous output value of the row counter, and generates a counter reset signal when output the carry signal. The B is the number of rows. A column counter increases a count value in increments of one in response to the carry signal. A mapper permutates the output of the counter according to a predetermined permutation rule. An adder generates a read address by using the output of the row counter as the most significant bits(MSB) of the read address and by using the output of the mapper as the least significant bits(LSB) of the read address.

9 Claims, 4 Drawing Sheets

ADDRESS GENERATING DEVICE FOR USE IN MULTI-STAGE CHANNEL INTERLEAVER/DEINTERLEAVER

BACKGROUND OF THE INVENTION

1. Field of the Invention

The present invention relates generally to a multi-stage channel interleaver/deinterleaver for a radio communication system, and in particular, to an address generating device for use in a multi-stage channel interleaver/deinterleaver.

2. Description of the Related Art

Generally, a radio communication system in which there exists a channel fading effect, performs channel interleaving and deinterleaving for mitigating the channel fading effect in order to ensure stable communication of digital source data to be transmitted by wire or wirelessly. For example, an IMT-2000 (International Mobile Telecommunication-2000) radio communication system, i.e., UMTS (Universal Mobile Telecommunication System) or CDMA-2000 (Code Division Multiple Access-2000) radio communication system, includes channel interleaver and deinterleaver for mitigating the channel fading effect.

With regard to a fundamental radio frame structure of the 3GPP ($3^{rd}$ Generation Partnership Project), the radio frame has a length of 10 ms and is comprised of 16 time slots. Therefore, standardization for each part of the system tends to be carried out based on the above frame structure. A fixed size multi-stage interleaver (FS-MIL) which is determined as a working assumption of a $2^{nd}$ interleaver is a 2-dimensional interleaver, in which the number of columns is fixed to 32. The MIL interleaver is designed to support a frame structure comprised of 16 time slots, and transmits data corresponding to 2 columns per time slot. Since the $1^{st}$ interleaver and the $2^{nd}$ interleaver both have a hardware structure supporting the number of columns which is a power of 2, it is possible to support both the $1^{st}$ interleaver and the $2^{nd}$ interleaver using one hardware module, thus reducing the hardware complexity.

In the meantime, harmonization of the CDMA-2000 system, which is North-American IMT-2000 system, and the European UMTS system is in progress. However, the CDMA-2000 system uses a radio frame structure comprised of 16 time slots per frame, and the UMTS uses a radio frame structure comprised of 15 time slots per frame. Therefore, it is not possible to use the existing CDMA-2000 channel interleaver, designed based on the 16 time slots per frame, for a UMTS channel interleaver. Thus, it is necessary to design the UMTS channel interleaver based on 15 time slots per frame.

Figure 1:
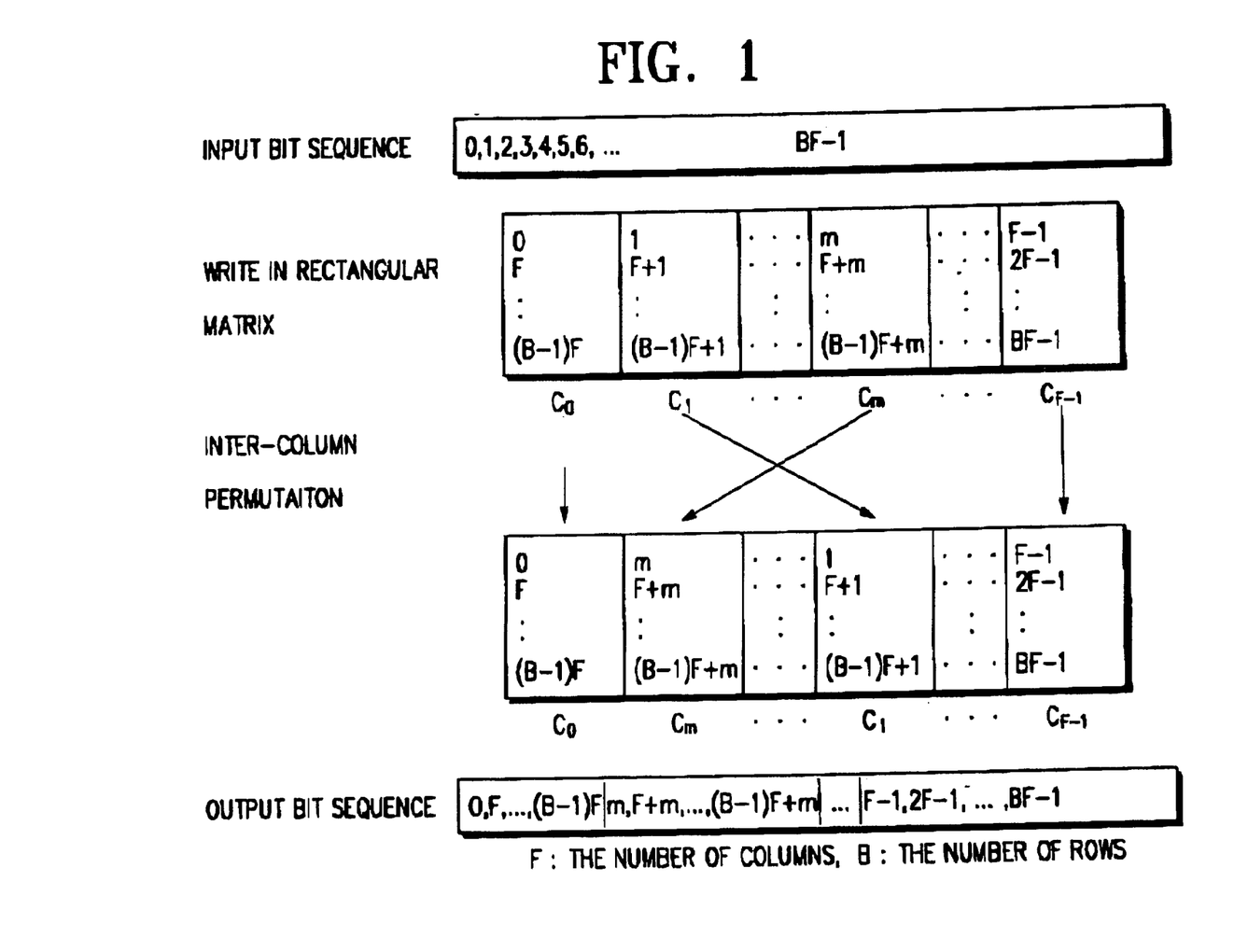
FIG. 1 is a diagram illustrating a fundamental interleaving technique.

FIG. 1 illustrates a fundamental MIL interleaving technique performed in the general $2^{nd}$ interleaver. A 10 ms input sequence is interleaved in the manner shown in FIG. 1. When the length of an input sequence is L≦F×B, the input sequence is stored in a 2-dimensional memory having a size of F×B, where F is the number of columns of the interleaver and B is the number of rows of the interleaver. Further, B is a minimum integer which satisfies L≦F×B for fixed F. At this point, the data is sequentially stored in the interleaver one row at a time. An other words, the data is stored in the first row and fill the first row before the data is stored in the second row and so on. Thus, the data is stored one row at a time starting from the top row with the data fills the bottom row. The sequentially stored input sequence are sequentially output as data corresponding to the respective rows of a given column in the order of the inter-column permutation pattern shown in Table 1 below. Table 1 shows a permutation pattern for F=32.

TABLE 1

| Interleaving Span | Number of Columns (F) | Inter-column Permutation Patterns |
|---|---|---|
| 10 ms | 1 | C0 |
| 20 ms | 2 | C0,C1 |
| 30 ms | 4 | C0,C2,C1,C3 |
| 40 ms | 8 | C0,C4,C2,C6,C1,C5,C3,C7 |

Figure 2:
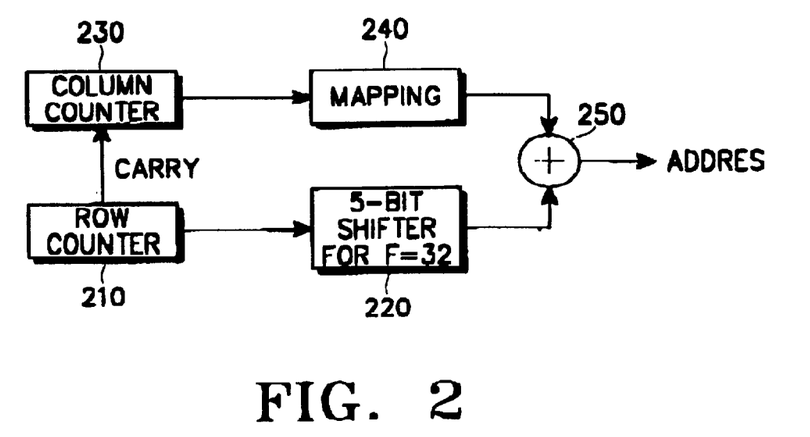
FIG. 2 is a block diagram illustrating an address generating device for use in a MIL channel interleaver/deinterleaver according to the prior art.

FIG. 2 illustrates an address generating device for the MIL interleaver according to the prior art. In this address generating device, the number of columns is 32 which is a power of 2. Although a description of the address generating device will be made for the case where it is applied to the channel interleaver, it will be understood by those skilled in the art that the address generating device may be applied to the channel deinterleaver.

Referring to FIG. 2, the address generating device includes a row counter 210, a column counter 230, a mapper 240, a 5-bit shifter 220, and an adder 250, which are the elements for generating an address to be used for the $2^{nd}$ channel interleaver. The row counter 210 and the column counter 230 count rows and columns of an interleaving memory (not shown), respectively. In the memory, the input data is sequentially stored in the order of row and column. The mapper 240 maps the columns counted by the column counter 230 to permuted columns. For example, the mapper 240 outputs the columns counted by the column counter 230 as permuted columns according to the inter-column permutation pattern shown in Table 1. The bit shifter 220 bit-shifts the value counted by the row counter 210. The adder 250 forms a new address by using the output of the bit shifter 220 as the most significant bits(MSB) of the new address and by using the output of the mapper 240 as the least significant bits(LSB) of the new address. Such an address is used to output the data which was sequentially stored in the memory in the order of row and column, as 2-dimensional interleaved data.

In the meantime, the conventional address generating device for the MIL interleaver includes the bit shifter 220. Such a bit shifter 220 is implemented by a 5-bit shifter, when the number of the columns is 32 which is a power of 2.

As described above, when the number of the columns is 32 which is a power of 2, a bit shift operation is performed by the 5-bit shifter 220 in order to obtain an address from the row counter 210. Here, the bit shifter 220 has a low hardware complexity.

However, if the number of time slots per frame is changed from 16 to 15, the number of the columns will also be changed, and there is a high probability that the new number of columns will not be a power of 2. For example, if it is assumed that the number of columns per time slot is 2 and the total number of the columns is 30, 30 multipliers are required and the hardware size of the multipliers will increase about twice the hardware size for the MIL $2^{nd}$ interleaver. When the number of columns of the MIL interleaver is not a power of 2 as stated above, it is not possible to use the bit shift operation as in the MIL $1^{st}$ interleaver for which the number of columns is 1, 2, 4 and 8. Therefore, there are required the multipliers, the number of which corresponds to the number of columns. In this case, the total hardware complexity of the interleaver increases about two times.

SUMMARY OF THE INVENTION

It is, therefore, an object of the present invention to provide an address generating device for implementing a MIL interleaver with the decreased hardware complexity.

It is another object of the present invention to provide an address generating device for performing an interleaving operation without an increase in the hardware complexity of an interleaver, even when the number of the columns of the MIL interleaver is not a power of 2.

It is further another object of the present invention to provide a device for generating an address for MIL $1^{st}$ and $2^{nd}$ interleavers using a single module.

To achieve the above and other objects, There is provided an address generating device for reading data from an interleaver memory having B rows by F columns, where the data from the memory are interleaved one column at a time by following predetermined column permutation rule. In addition the number of columns in the interleaver memory, F is not equal to an integer power of 2, i.e. $F \neq 2^k$ where k is a positive integer. An row counter responsive to B clock pulses, output offset values from 0 to (B–1)×F in increments of F, each offset value outputted with successive clock pulses, and generates a carry signal when the B clock pulses are completed. A column counter increases a count value in increments of one in response to the carry signal. A mapper permutates a signal sequence output from the column counter. An adder adds the permuted signal sequence output from the mapper to the signal output from the row counter to generate the addresses.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 3:
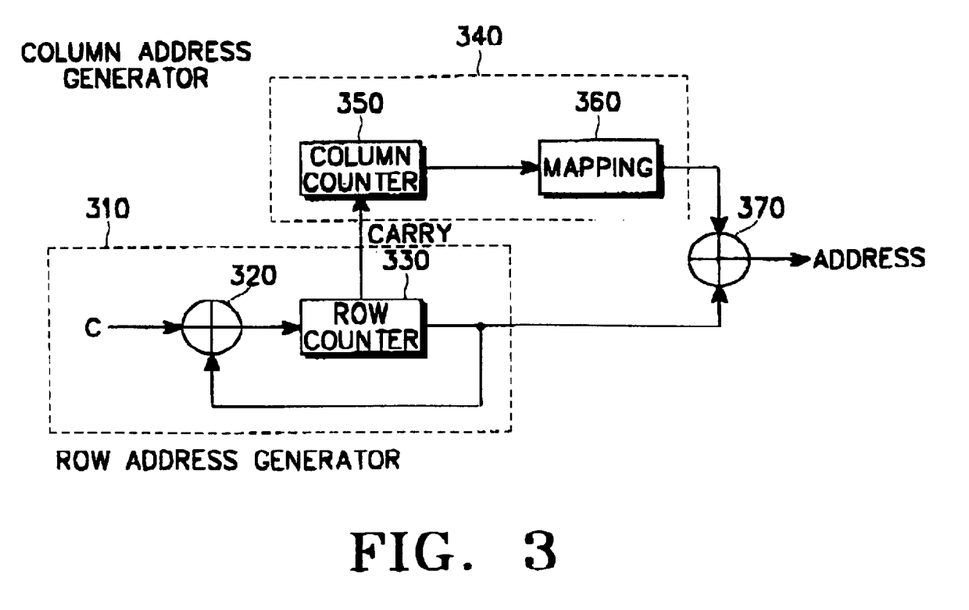
FIG. 3 is a block diagram illustrating an address generating device for use in a MIL interleaver/deinterleaver according to an embodiment of the present invention.

FIG. 3 illustrates an address generating device for the MIL $2^{nd}$ interleaver according to an embodiment of the present invention, in which the number of columns is assumed to be a given number F.

Referring to FIG. 3, the address generating device according to an embodiment of the present invention includes a row address generator 310, a column address generator 340, and an adder 370 forms an actual interleaving address by using the output of the row counter 330 as the most significant bits(MSB) of the interleaving address and by using the output of the mapper 360 as the least significant bits(LSB) of the interleaving address, an adder 370 for generating an actual interleaving address by adding a row address and a column address, generated from the row address generated 310 and the column address generator 340. The row address generator 310 is comprised of an adder 320 and an row counter 330, and the column address generator 340 is comprised of a column counter 350 and a mapper 360.

The address generating device of FIG. 3 generates a row address having an offset using the adder 320 rather than performing multiplication in the process of generating a row address of the MIL $2^{nd}$ interleaver, thereby making it possible to implement the same interleaving function with the lower hardware complexity.

First, with reference to FIG. 3, a description will be made of an operation of the MIL $2^{nd}$ interleaver.

The row address generator 310 shown in FIG. 3 includes a row counter 330 and an adder 320. The row counter 330 basically counts from 0 to B–1, where B=the number of rows. In the beginning when the count in the row counter 330 is equal to zero, the row counter 330 outputs a value of zero. As soon as the row counter 330 generates an output, the count in the row counter 330 increases by one in response to a clock pulse. The output from the row counter 330 is then inputted into the adder 370 and to the adder 320. The adder 320 then adds the output of the row counter 330 with the offset value 'C' and inputs the added value into the row counter 330, as shown in FIG. 3. In preferred embodiments of the present invention, C=30. The row counter 330 receives the output of the adder 320 and outputs the received value as its own output (i.e., the output of the adder 320 passes through the row counter 330). As soon as the row counter 330 outputs a new value, the count in the row counter 330 increases by one. The above described process is repeated until the count in the row counter 330 reaches B–1. Thus, the output of the row counter 330 increases by 'C' after each clock cycle. After the count in the row counter 330 reaches B–1, the row counter 330 outputs a value equal to C*(B–1) because the adder 320 adds C*(B–2) (that is, the previous output) with 'C' and inputs the value of C*(B–1) into the row counter 330. As soon as the row counter outputs a value of C*(B–1), the count in the row counter does not increase by one, but resets back to zero. At the same time, the row counter 330 outputs a carry signal to the column counter 350. After the count in the row counter 330 resets back to zero, the row counter 330 outputs a value of zero as described above, and the above described process is repeated.

The column counter 350 increases its count value one by one from 0 to 29 whenever the reset signal (or carry) is generated. For example, the column counter 350 first outputs '0', generates '1' when the accumulator 330 first generates the carry signal, and then generates '2' when the accumulator 330 generates the next carry signal.

For column permutation, the mapper 360 maps the values corresponding to 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, output from the column counter 350 to the values 0, 15, 1, 16, 2, 17, 3, 18, 4, 19, 5, 20, 6, 21, 7, 22, 8, 23, 9, 24, 10, 25, 11, 26, 12, 27, 13, 28, 14, 29. When the number of the columns of the interleaver is 32, column permutation is performed based on Table 2 below. However, when the number of the columns of the interleaver is 30, the column permutation method can be different from the number of the columns of the interleaver is $2^k$. Therefore, the mapping order of the mapper 360 may vary according to the permutation method. The interleaving address is generated by using the output of the row counter 330 as the most significant bits(MSB) of the interleaving address and by using the output of the mapper 360 as the least significant bits(LSB) of the interleaving address.

TABLE 2

| Number of Columns (F) | Inter-column Permutation Patterns |
|---|---|
| 32 | C0,C16,C8,C24,C20,C12,C28,C18,C2,C26,C10, C22,C6,C30,C14,C17,C1,C25,C9,C21,C5,C29, C13,C3,C19,C11,C27,C7,C23,C15,C31 |

Operation of the address generating device will be described below. For simplicity, it will be assumed herein that the count value from the column counter 350 is output without column permutation by the mapper 360.

For example, if it is assumed that the number of the rows is B=5 and the number of the columns is F=30, the row address generator 310 sequentially outputs 0, 30, 60, 90, 120, which are the value having an offset of 30 from 0 to 4 (=B−1=5−1), in response to clock pulses. At this point, since the column counter 350 in the column address generator 340 outputs '0' as a count value, the adder 370 will sequentially output 0, 30, 60, 90, 120 as an interleaving address. When 120 is output, the row counter 330 in the row address generator 310 generates a carry. And the row address generator 310 generates a reset signal for resetting the row counter 330 to 0 when the row counter 330 count to the number of rows B. In response to the carry, the column counter 350 will output '1' by increasing the count value by '1', and the row address generator 310 sequentially outputs 0, 30, 60, 90, 120, which are the value having an offset of 30 from 0 to 4 (=B−1), in response to the clock pulses. As a result, the adder 370 will sequentially output 16(0+16), 46(30+16), 76(60+16), 106(90+16), 136(120+16) as an interleaving address by adding the output value of the row address generator 310 to the output value of the column address generator 340. When the above operation is repeated next time, the adder 370 will sequentially output 8(0+8), 38(30+8), 68(60+8), 98(90+8), 128(120+8) as an interleaving address. Such an operation is repeatedly performed until the adder 370 sequentially outputs 31(0+31), 61(30+31), 91(60+31), 121(90+31), 151(120+31) as an interleaving address.

Figure 4:
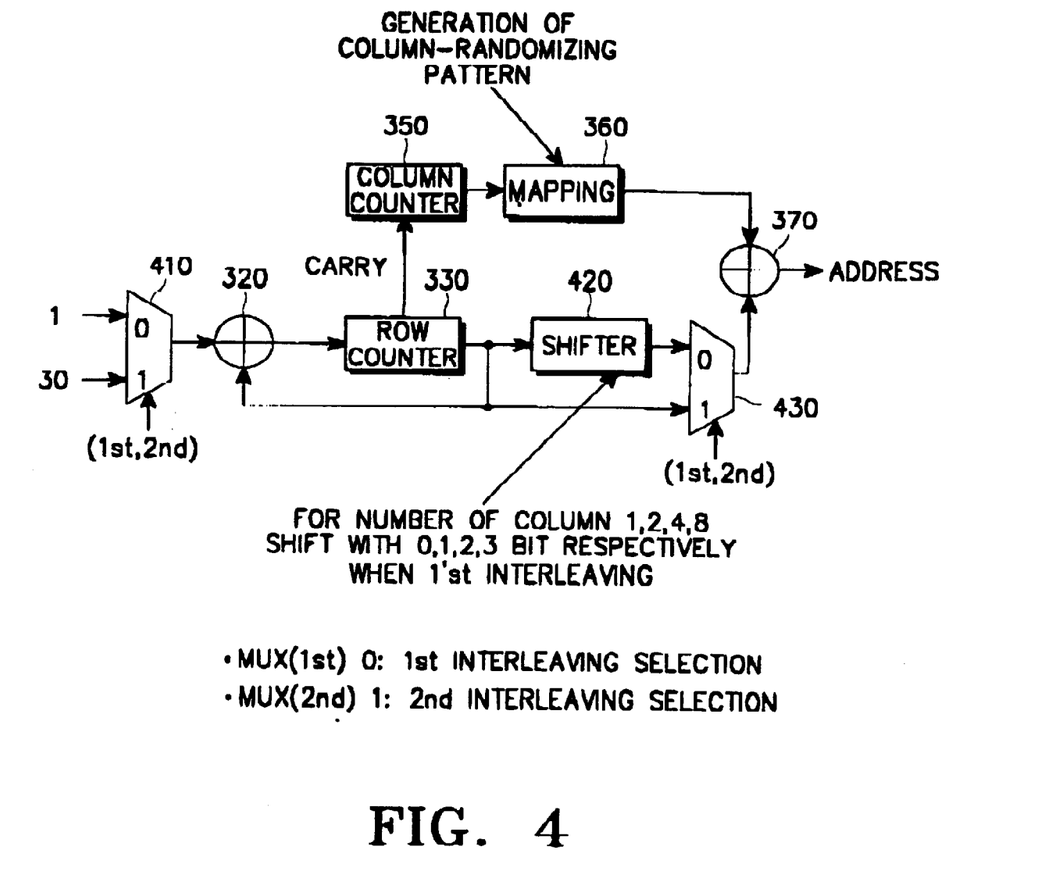
FIG. 4 is a block diagram illustrating an address generating device for use in a MIL interleaver/deinterleaver according to another embodiment of the present invention.

FIG. 4 illustrates an address generating device for the MIL interleaver according to another embodiment of the present invention, in which the $2^{nd}$ interleaver structure is implemented by the $1^{st}$ interleaver and a single module.

Referring to FIG. 4, when the MIL interleaver operates as the $1^{st}$ interleaver, multiplexers (or selectors) 410 and 430 select '0', and when the MIL interleaver operates as the $2^{nd}$ interleaver, the multiplexers 410 and 430 select '1', so as to allow the MIL channel interleaver to operate as shown in FIG. 3. The row counter 330, the column counter 350, and the mapper 360 are shared by the $1^{st}$ and $2^{nd}$ interleavers to minimize the hardware complexity.

The address generating device according to the embodiment of FIG. 4 of the present invention includes a first selector 410. The first selector 410 receives a first offset value 1 and a second offset value 30 at its first and second input nodes 0 and 1, respectively, and selectively outputs one of the received offset values according to whether a first or second interleaver select signal (shown as $1^{st}, 2^{nd}$" in FIG. 4) is input to selector 410. The adder 320 adds the offset value selectively provided from the first selector 410 to the output value of the row counter 330. The row counter 330 output the added address from adder 320 which add the output of the multiplexer 410 and the row counter 330. When the counting operation is performed 0 to (B−1) times in response to B clock pulses, the row counter 330 generates a carry signal to column counter 350 and reset the row counter to 0. The output of the row counter 330 is applied to an input node 0 of a second selector 430 via a shifter 420, and applied to another input node 1 of the second selector 430. The output of the row counter 330 is also applied to the adder 320. The shifter 420 is comprised of 0-bit, 1-bit, 2-bit and 3-bit shifters, when the number of the columns is a power of 2, such as 1, 2, 4 and 8. The second selector 430 selects one of the values received at its first and second input nodes 0 and 1 according to whether the first or second interleaver select signal ($1^{st}$ and $2^{nd}$) is input to second selector 430, and outputs the selected value as a row address.

The column counter 350 increases a count value one by one from 0 to 29 whenever the reset signal (or carry) is generated. The mapper 360 maps the resulting count value output from the column counter 350 according to a column permutation/randomizing pattern. The adder 370 generates an interleaving address by adding the row address generated by the second selector 430 to the column address generated by the mapper 360. The generated address is used to output the data which was stored in the interleaver memory in the order of row and column, as interleaved data.

With reference to FIG. 4, a description will be made of operation of the address generating device for the combined MIL $1^{st}/2^{nd}$ interleaver. Here, a $1^{st}$ select signal is used at MUX 410 and MUX 430 for selecting the $1^{st}$ interleaving operation, and a $2^{nd}$ select signal is used at MUX 410 and MUX 430 for selecting the $2^{nd}$ interleaving operation.

During $1^{st}$ interleaving of the MIL interleaver of FIG. 4, the function block selects '0' paths of the multiplexers 410 and 430, and the interleaving operation at this time is equal to the existing interleaving operation shown in FIG. 2. At this point, column permutation is performed as shown in Table 1. A shifting bit size of the shifter 420 also depends on the number, F, of the columns of the interleaver. For example, when the number of the columns is 1, 2, 4 and 8, which are a power of 2, the shifter 420 is comprised of 0-bit, 1-bit, 2-bit and 3-bit shifters, respectively.

During $2^{nd}$ interleaving of the MIL interleaver, the function block has the following operation. During $2^{nd}$ interleaving operation, '1' paths of the multiplexers 410 and 430 are selected, and the row counter 330, having an offset of 30 when the number of the columns of the MIL $2^{nd}$ interleaver is 30, performs an counting operation from 0 to B−1 in response to each of the B clock pulses, maintaining the offset 30, and generates a signal representing the value which is added with the offset value and the feedback value of the row counter as a row address signal. When counting is performed for the $(B-1)^{th}$ clock, the row counter 330 generates the carry and a reset signal.

The column counter 350 increases its count value one by one from 0 to 29, whenever the reset signal (or carry) is generated. For column permutation, the mapper 360 maps the values corresponding to 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, output from the column counter 350 to the values 0, 15, 1, 16, 2, 7, 3, 18, 4, 19, 5, 20, 6, 21, 7, 22, 8, 23, 9, 24, 10, 25, 11, 26, 12, 27, 13, 28, 14, 29. When the number of the columns of the interleaver is 32, column permutation is performed based on Table 2. However, when the number of the columns of the interleaver is 30, the column permutation method can be different from the number of the columns of the interleaver is $2^k$. Therefore, the mapping order of the mapper 360 may vary according to the permutation method. The row address and the column address generated by the row counter 330 and the column counter 350 are added to each other by the adder 370, to generate an actual interleaving address.

Figure 5:
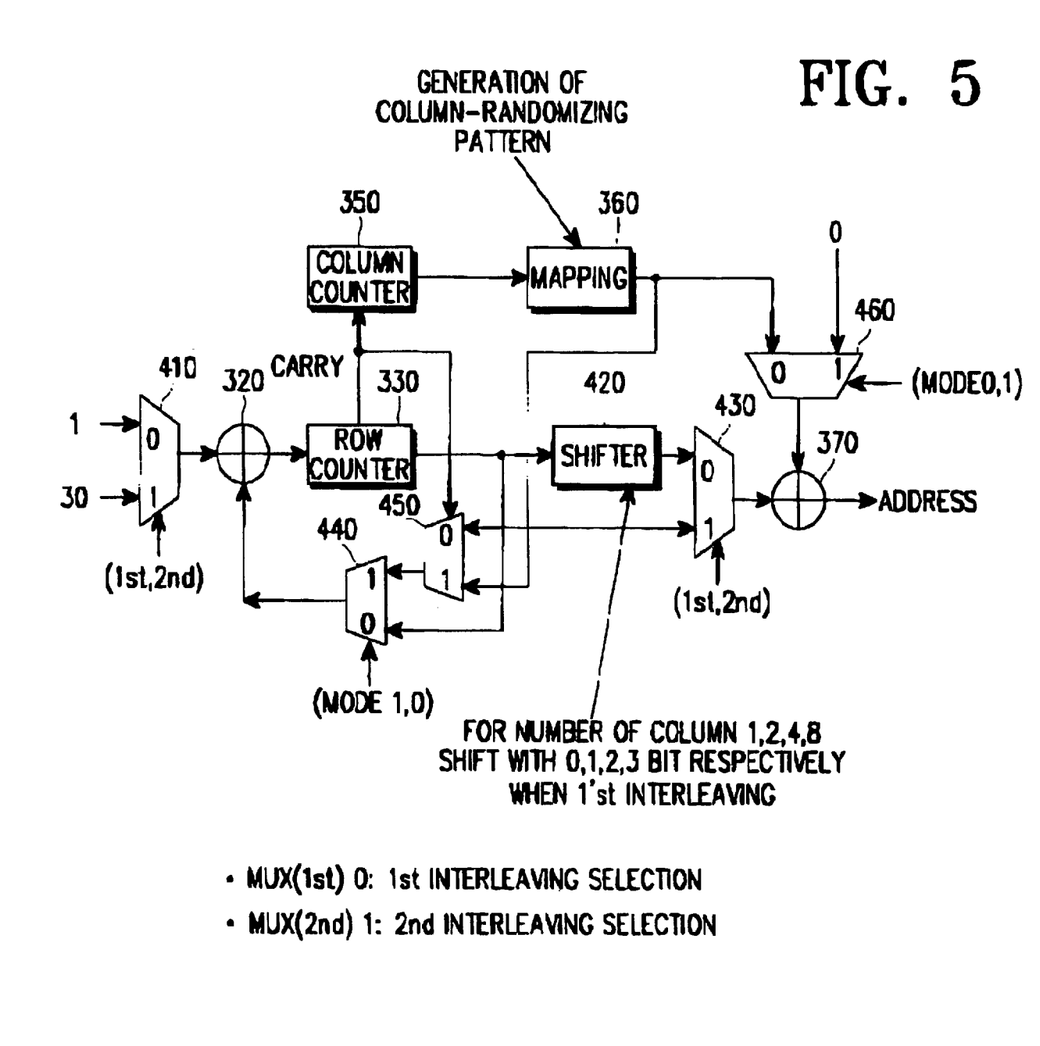
FIG. 5 is a block diagram illustrating an address generating device for use in a MIL interleaver/deinterleaver according to further another embodiment of the present invention.

FIG. 5 illustrates an address generating device for MIL interleaving according to further another embodiment of the present invention, wherein a $1^{st}$ select signal is used at MUX 410 and MUX 430 for selecting the $1^{st}$ interleaving operation and a $2^{nd}$ select signal is used at MUX 410 and MUX 430 for selecting the $2^{nd}$ interleaving operation. Further, 'mode 0' is a select signal used at MUX 460 for performing interleaving by adding an offset of the corresponding column to a calculated row address after calculating the row address, and 'mode 1' is a select signal for performing interleaving by initializing the row address to the corresponding column address. The 'mode 0' and 'mode 1' signals are provided to the multiplexers (or selectors) 440, 450 and 460.

The address generating device according to further another object of the present invention includes the selectors 440, 450 and 460 in addition to the structure of the address generating device of FIG. 4. The selectors 440 and 450 are connected between the row counter 330 and the adder 320, and the selector 460 is connected between the mapper 360 and the adder 370. The selectors 440 and 460 are controlled by the mode control signals (mode 0, 1), and the selector 450 is controlled by the carry generated from the row counter 330.

First, a description will be made as to how the address generating device operates when the mode control signal 'mode 0' is received.

In response to the 'mode 0' signal, the selector 440 makes a connection such that the output of the row counter 330 should be applied to the adder 320, and the selector 460 makes a connection such that the output of the mapper 360 should be applied to the adder 370. When the row counter 330 performs a sequential outputting the added value of offset value 1 and previous output of the row counter 300, the selector 450 connects its input node 0 to the input node 1 of the selector 440. When the row counter 330 generates the carry signal, the selector 450 connects its input node 1 to the input node 1 of the selector 440. However, in spite of the selective signal outputting operation of the selector 450, the selector 440 has the input node 0 which is always connected to the output node. Therefore, the structure having such a connection generates the row address and then adds the generated row address to the corresponding column address, thereby to generate the interleaving address, as in the structure shown in FIG. 4.

Next, a description will be made as to how the address generating device operates when the mode control signal 'mode 1' is received. For simplicity, it will be assumed herein that the number of rows is B=5, the number of columns is F=30, and the mapper 360 is omitted.

In response to the 'mode 1' signal, the selector 440 makes a connection such that the output of the selector 450 should be applied to the adder 320, and the selector 460 makes a connection such that '0' should be added to the adder 370. When the row counter 330 performs a sequential outputting the added value of the previous output value of the row counter 330 and offer value 30, the selector 450 connects its input node 0 to the input node 1 of the selector 440. When the row counter 330 generates the carry signal, the selector 450 connects its input node 1 to the input node 1 of the selector 440. Therefore, in the structure having such a connection, the row counter 330 sequentially outputs the values of 0, 30 , 60, 90, 120, having the offset 30, from 0 to 4 (=B−1=5−1) in response to the clock pulses. In this state, the row counter 330 generates a carry signal, and in response to the carry signal, the selector 450 connects its input node 1 to the input node 1 of the selector 440. Accordingly, the column counter 350 generates '1' as the next count value, and this output value '1' is applied to the adder 320 through the selector 450 and the selector 440. As a result, the adder 320 receives '1' at its one input node and the row counter 330 sequentially outputs the values of 1, 31, 61, 91, 121 in response to the received value '1'. Thereafter, the row counter 330 will sequentially output the value of 2, 32, 62, 92, 122 by repeatedly performing the above operation. Therefore, the structure having such a connection generates the interleaving address by initializing the row address to the corresponding column address. That is, the address generating device generates the interleaving address by first adding the row address to the column address, and outputs the generated interleaving address through the selector 430 and the adder 370.

TABLE 3

| Circuit | | Number of Hardwares |
|---|---|---|
| MIL using Multiplier (Prior Art) | Adder | 90 |
| | Multiplier | 206 |
| | Shifter | 45 |
| | Column Counter | 65 |
| | Row Counter | 65 |
| | Mapping Circuit | 40 |
| | Total | 511 |
| MIL using Offset Adder (Invention) | Adder | 90 |
| | Shifter | 45 |
| | Column Counter | 65 |
| | row counter (Offset Adder) | 90 |
| | Mapping Circuit | 40 |
| | Total | 330 |

From Table 3, it is noted that the total hardware complexity of the conventional address generating device is about twice as compared with that of the novel address 5 generating device, when the number of the columns of the MIL $2^{nd}$ interleaver is not a power of 2, i.e., when there are required the multipliers, the number of which corresponds to the number of the columns, because it is not possible to use the bit shift operation as in the MIL $1^{st}$ interleaver for which the number of columns is 1, 2, 4 and 8. However, the total hardware complexity of the novel address generating device is about ½ the hardware complexity of the conventional address generating device.

As described above, it is possible to implement the same interleaving function with the lower hardware complexity by generating a row address having an offset using an adder instead of the multipliers in the process of calculating the row address of the MIL $2^{nd}$ interleaver. Further, the invention shares the hardware for implementation of the $1^{st}$ interleaver and the $2^{nd}$ interleaver by using the adder instead of the multipliers, thereby to implement the interleaver which can minimize the total hardware complexity of the system.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An address generating device for addressing data stored in an interleaver memory in B rows and F columns, where F is not $2^k$ for a positive integer k, the device comprising:

an row counter responsive to B clock pulses, for outputting a carry signal when the row counter counts to B−1, for outputting the 0 value when the first row address is output, for outputting the added value of offset value F and the previous output value of the row counter, and for generating a carry signal when the B clock pulses are completed, wherein the B is the number of rows;

a column counter for increasing a count value in increments of one in response to the carry signal;

a mapper for permuting the output of the column counter according to a predetermined permutation rule; and an adder for generating a read address by using the output of the row counter as the most significant bits(MSB) of the read address and by using the output of the mapper as the least significant bits(LSB) of the read address.

2. A device for generating an address for interleaving data stored in an interleaver memory in B rows and F columns, where F is not $2^k$ for a positive integer k, the device comprising:

a row address generator for generating B row addresses in response to each of B clock pulses, said B row addresses including a value of 0 and values determined by sequentially outputting the number F from 1 to (B−1) times, and generating a carry signal when the B row addresses are generated;

a column address generator for outputting a count value which increases in increments of one in response to the carry signal, and generates a column address by permutating the count value according to the predetermined permutation rule; and an adder for adding the row address to the column address to generate the address.

3. The device as claimed in claim 2, wherein the row address generator comprises:

a row counter for outputting the value of 0 in response to a first one of the B clock pulses, receiving an input value in response to each of the remaining (B−1) clock pulses, and outputting the added value as the row address; and an adder that also receives the output of the row counter and the number F of the columns as an offset value, adds the output of the row counter to the offset value, and provides the added value to the row counter for each of the remaining (B−1) clock pulses.

4. The device as claimed in claim 2, wherein the column address generator comprises:

a column counter for outputting a count value which increases in increments of one in response to the carry signal; and a mapper for permuting the count value output from the column counter according to the permutation rule, to output the column address.

5. A device for generating an address for use in a first interleaver or a second interleaver including an interleaver memory in which data is stored in order of row and column, the device comprising:

a first selector for selectively outputting a first offset value for the first interleaver and a second offset value for the second interleaver according to an interleaver select signal;

a row address generator for generating B row addresses in response to each of B clock pulses, said B row addresses including a value of 0 and values determined by sequentially added values of the selected first or second offset value and the previous output of the row address from 1 to (B−1) times, and generating a carry signal when the B row addresses are generated;

a column address generator for outputting a count value which increases in increments of one in response to the carry signal, and generates a column address by permuting the count value according to a preset permutation pattern;

a shifter for shifting the row address by F bits;

a second selector for selectively outputting an output of the shifter and the row address according to the interleaver select signal; and an adder for adding an output address of the second selector to the column address, to generate the address.

6. The device as claimed in claim 5, wherein the row address generator comprises:

a row counter for outputting the value of 0 in response to a first one of the B clock pulses, receiving a value which is determined by adding one of the offset value and the previous output value of the row counter in response to each of the remaining (B−1) clock pulses, and outputting the value as the row address; and an adder that receives the previous output of the row counter and a selected one of the first and second offset values, adds the output of the row counter to the selected offset value, and provides the added value to the row counter for each of the remaining (B−1) clock pulses.

7. The device as claimed in claim 5, wherein the column address generator comprises:

a column counter for outputting a count value which increases in increments of one in response to the carry signal; and a mapper for permuting the count value output from the column counter according to the permutation pattern, to output the column address.

8. The device as claimed in claim 5, wherein the first offset value is 1.

9. The device as claimed in claim 5, wherein the second offset value is the number of the columns.

* * * * *

UNITED STATES PATENT AND TRADEMARK OFFICE
CERTIFICATE OF CORRECTION

PATENT NO.     : 6,363,026 B1
DATED          : March 26, 2002
INVENTOR(S)    : Su et al.

It is certified that error appears in the above-identified patent and that said Letters Patent is hereby corrected as shown below:

Title page,
Item [56], insert the following:

--Foreign Patent Documents
09062585      3/7/97         Japan
1998-025564   7/15/98        Korea --

Signed and Sealed this

Eleventh Day of June, 2002

Attest:

Attesting Officer

JAMES E. ROGAN
*Director of the United States Patent and Trademark Office*